United States Patent
Irwin et al.

(10) Patent No.: US 12,116,663 B2
(45) Date of Patent: Oct. 15, 2024

(54) METHOD FOR SOLVENT-FREE PEROVSKITE DEPOSITION

(71) Applicant: CubicPV Inc., Dallas, TX (US)

(72) Inventors: Michael D. Irwin, Heath, TX (US);
Marissa Higgins, Forney, TX (US);
David W. Miller, Dallas, TX (US)

(73) Assignee: CubicPV Inc., Bedford, MA (US)

( * ) Notice: Subject to any disclaimer, the term of this patent is extended or adjusted under 35 U.S.C. 154(b) by 0 days.

(21) Appl. No.: 16/852,142

(22) Filed: Apr. 17, 2020

(65) Prior Publication Data
US 2020/0332408 A1    Oct. 22, 2020

Related U.S. Application Data

(60) Provisional application No. 62/836,376, filed on Apr. 19, 2019.

(51) Int. Cl.
| | |
|---|---|
| *C23C 14/08* | (2006.01) |
| *C23C 14/24* | (2006.01) |
| *C23C 14/32* | (2006.01) |
| *C23C 14/34* | (2006.01) |
| *C23C 14/50* | (2006.01) |

(52) U.S. Cl.
CPC .......... *C23C 14/088* (2013.01); *C23C 14/243* (2013.01); *C23C 14/325* (2013.01); *C23C 14/3407* (2013.01); *C23C 14/50* (2013.01)

(58) Field of Classification Search
CPC ..... C23C 14/088; C23C 14/325; C23C 14/50; C23C 14/243; C23C 14/3407
See application file for complete search history.

(56) References Cited

U.S. PATENT DOCUMENTS

| | | | | |
|---|---|---|---|---|
| 5,618,761 | A * | 4/1997 | Eguchi .................... | H01L 28/55 438/785 |
| 9,941,480 | B2 | 4/2018 | Irwin et al. | |
| 2004/0238861 | A1* | 12/2004 | Hwang ................... | H01L 28/75 257/295 |
| 2013/0104969 | A1* | 5/2013 | Rappe ............... | H01L 31/03529 136/255 |
| 2016/0226011 | A1* | 8/2016 | Nazeeruddin ....... | H01L 51/4213 |
| 2017/0148579 | A1 | 5/2017 | Snaith et al. | |
| 2017/0229647 | A1* | 8/2017 | Qi ....................... | C23C 14/0021 |

(Continued)

FOREIGN PATENT DOCUMENTS

| | | |
|---|---|---|
| CN | 106463625 A | 2/2017 |
| CN | 107109628 A | 8/2017 |

(Continued)

OTHER PUBLICATIONS

Vacuum Science World, https://www.vacuumscienceworld.com/ultra-and-extreme-high-vacuum, accessed online Nov. 1, 2021 (Year: 2021).*

(Continued)

*Primary Examiner* — Michael G Miller
(74) *Attorney, Agent, or Firm* — Baker Botts L.L.P.

(57) ABSTRACT

A method for solvent-free perovskite deposition. The method comprises loading a lead target and one or more samples adhered to a substrate holder into a deposition chamber, pumping down to a high vacuum pressure, and backfilling the deposition chamber with the vapor of a salt precursor to form a perovskite material.

6 Claims, 1 Drawing Sheet

(56) References Cited

U.S. PATENT DOCUMENTS

| | | | |
|---|---|---|---|
| 2017/0268094 A1* | 9/2017 | Miyadera | H01G 9/2009 |
| 2017/0268128 A1 | 9/2017 | Qi et al. | |
| 2018/0005764 A1 | 1/2018 | Jones et al. | |
| 2018/0248118 A1 | 8/2018 | Kwok et al. | |

FOREIGN PATENT DOCUMENTS

| | | | |
|---|---|---|---|
| CN | 105779956 B | 2/2018 | |
| WO | WO2015170445 A1 | 11/2015 | |
| WO | 2016031727 A1 | 3/2016 | |
| WO | WO-2017009688 A1 * | 1/2017 | H01L 51/4213 |

OTHER PUBLICATIONS

Salt Definition, via Oxford English Dictionary, https://www.oed.com/view/Entry/170146?rskey=0HWS8n&result=1#eid , entry 6.a (Year: 2021).*

Infotracks (https://www.semitracks.com/newsletters/april/2013-april-newsletter.pdf) (Year: 2013).*

International Search Report and Written Opinion issued in related PCT Application No. PCT/US2020/028827 mailed Aug. 4, 2020, 18 pages.

Popov, Georgi, et al. "Atomic layer deposition of PbI2 thin films." Chemistry of Materials 31.3 (2019): 1101-1109.

Li, Tianyang, et al. "Melting temperature suppression of layered hybrid lead halide perovskites via organic ammonium cation branching." Chemical science 10.4 (2019): 1168-1175.

Petrov, Andrey A., et al. "A new formation strategy of hybrid perovskites via room temperature reactive polyiodide melts." Materials Horizons 4.4 (2017): 625-632.

Zheng, Maxwell, et al. "Thin-Film Solar Cells with InP Absorber Layers Directly Grown on Nonepitaxial Metal Substrates." Advanced Energy Materials 5.22 (2015): 1501337.

Wang, Hsin-Ping, et al. "Increased optoelectronic quality and uniformity of hydrogenated p-InP thin films." Chemistry of Materials 28.13 (2016): 4602-4607.

PCT International Preliminary Report on Patentability and Written Opinion mailing date Oct. 28, 2021, 13 pages.

Communication pursuant to Rule 62 EPC with Supplementary European Search Report, mailed Mar. 17, 2023, European Application No. 20791576.0, 16 pages.

Communication pursuant to Rule 164(1) EPC with Supplementary Partial European Search Report, mailed Dec. 14, 2022, European Application No. 20791576.0, 21 pages.

Hao Hu et al: "Vapour-based processing of hole-conductor-free CH 3 NH 3 PbI 3 perovskite/C 60 fullerene planar solar cells", RSC Advances, vol. 4, No. 55, Jun. 19, 2014 (Jun. 19, 2014), p. 28964-28967, XP055213208, DOI: 10.1039/C4RA03820G.

Hao Hu et al: "Electronic Supplementary Information Vapour-based processing of hole-conductor-free CH 3 NH 3 PbI 3 perovskite/C 60 fullerene planar solar cells", Jul. 3, 2014 (Jul. 3, 2014), pp. 1-3, XP055213210, Retrieved from the Internet: URL:http://www.rsc.org/suppdata/ra/c4/c4ra03820g/c4ra03820g1.pdf [retrieved on Sep 14, 2015].

Mattox Donald: "Vacuum Evaporation and Vacuum Deposition" In: "Vacuum Evaporation and Vacuum Deposition", Jan. 1, 2010 (Jan. 1, 2010), XP093005564, pp. 195-195.

Yuan Shuai et al: "Growth temperature-dependent performance of planar CH 3 NH 3 PbI 3 solar cells fabricated by a two-step subliming vapor method below 120° C", RSC Advances, [Online] vol. 6, No. 53, Jan. 1, 2016 (Jan. 1, 2016), pp. 47459-47467, XP093005122, DOI: 10.1039/C6RA07686F, Retrieved from the Internet: URL: https://pubs.rsc.org/en/content/articlepdf/2016/ra/c6ra07686f> [retrieved on Dec. 6, 2022].

Notification of first office action for Chinese Application No. 202080038466.4 mailed Oct. 11, 2023, China International Property Administration, 23 pages.

Japanese office action, Japanese Patent Application No. 2021-562010, dated Apr. 16, 2024, 8 pages.

Examination report under sections 12 & 13 of the Patents Act, 1970 and the Patent Rules, 2003, Indian Application No. 202117047368, mailed May 10, 2024, 6 pages.

Notification of Second Office Action, Chinese Application No. 202080038466.4, mailed Jun. 5, 2024, China International Property Administration, 13 pages.

* cited by examiner

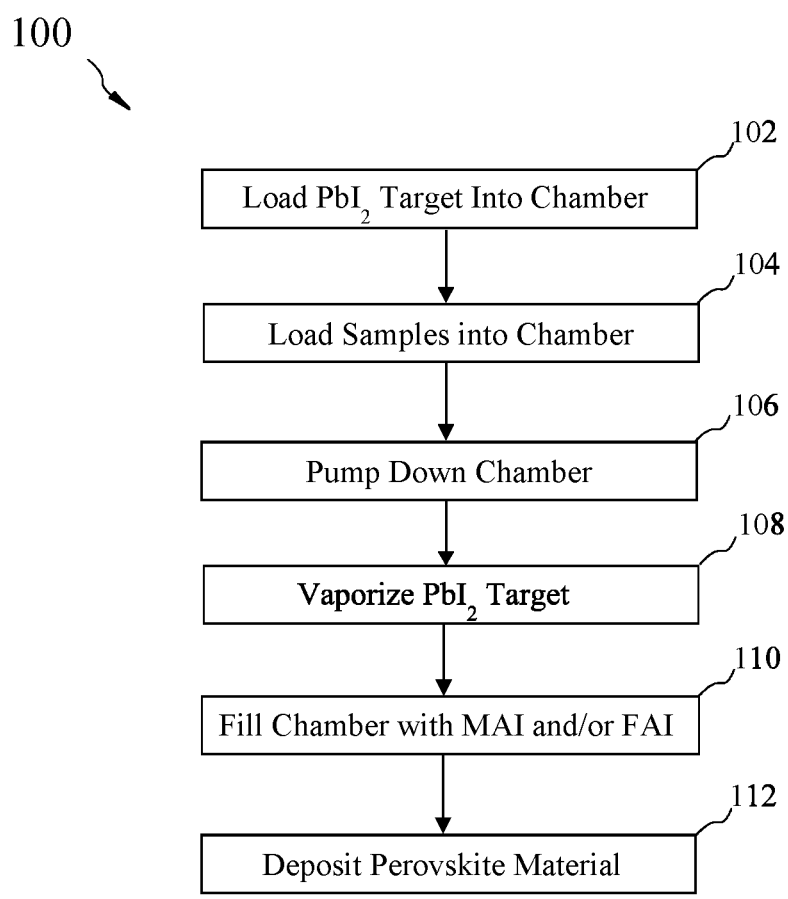

METHOD FOR SOLVENT-FREE PEROVSKITE DEPOSITION

TECHNICAL FIELD

This application relates generally to compositions for use in photovoltaic and optoelectronic devices, and more particularly to methods for solvent-free perovskite deposition.

BACKGROUND

Use of photovoltaics (PVs) to generate electrical power from solar energy or radiation may provide many benefits, including, for example, a power source, low or zero emissions, power production independent of the power grid, durable physical structures (no moving parts), stable and reliable systems, modular construction, relatively quick installation, safe manufacture and use, and good public opinion and acceptance of use.

Perovskite materials may be incorporated into one or more aspects of a PV device. PVs using perovskite components are more tolerant of internal defects than silicon-based PVs. This greater tolerance reduces the cost of production. However, the traditional, solvent-based methods of manufacturing perovskite cells can lead to uneven thickness across a layer. This limits the ability to effectively coat large surfaces and to generate efficient multi-stack films.

The features and advantages of the present disclosure will be readily apparent to those skilled in the art. While numerous changes may be made by those skilled in the art, such changes are within the spirit of the invention.

SUMMARY OF THE DISCLOSURE

According to one embodiment, a method for solvent-free perovskite deposition comprises loading a lead target and a substrate into a deposition chamber. The method further comprises reducing the pressure in the deposition chamber to less than or equal to $5 \times 10^{-6}$ Torr. The method further comprises vaporizing the lead target. Further still, the method comprises backfilling the deposition chamber with the vapors of a salt precursor. Finally, the method comprises depositing a perovskite material on the substrate.

In another embodiment, a method for solvent-free perovskite deposition comprises loading a lead powder sample into a crucible. The method further comprises placing a substrate face-down over the powder in the crucible. The method further comprises reducing the pressure in the deposition chamber to 200 mTorr. The method further comprises sublimating the lead powder sample. Finally, the method comprises making a first deposition on the substrate.

In a further embodiment, a method for solvent-free perovskite deposition comprises loading a lead salt precursor into a crucible. The method further comprises loading a substrate into a sample holder. The method further comprises reducing the pressure in the deposition chamber to at least $10^{-3}$ Torr. The method further comprises applying a current to ionize the lead salt precursor. The method further comprises backfilling the deposition chamber with the vapors of a second salt precursor. Finally, the method comprises depositing a perovskite material on the substrate.

In yet another embodiment, a method for solvent-free perovskite deposition comprises loading a lead salt precursor into a crucible. The method further comprises loading a substrate in a sample holder. The method further comprises reducing the pressure in the deposition chamber to between 5 Torr and 760 torr. The method further comprises vaporizing the lead salt precursor. The method further comprises performing metalorganic vapor phase epitaxy on the vapor. The method further comprises backfilling the deposition chamber with the vapors of a second salt precursor. Finally, the method comprises depositing, under an inert gas, a perovskite material on the substrate.

BRIEF DESCRIPTION OF THE DRAWINGS

FIG. 1 is a flowchart for an example method of solvent-free perovskite deposition.

DETAILED DESCRIPTION OF PREFERRED EMBODIMENTS

The methods described in the present disclosure for depositing perovskite onto a substrate may be used to manufacture one or more aspects of a PV. Other potential applications include, but are not limited to, batteries, field-effect transistors (FETs), light-emitting diodes (LEDs), non-linear optical devices, memristors, capacitors, rectifiers, and/or rectifying antennas. A perovskite material may be of the general formula $CMX_3$, where: C comprises one or more cations (e.g., an amine, ammonium, phosphonium, a Group 1 metal, a Group 2 metal, and/or other cations or cation-like compounds); M comprises one or more metals (examples including Be, Mg, Ca, Sr, Ba, Fe, Cd, Co, Ni, Cu, Ag, Au, Hg, Sn, Ge, Ga, Pb, In, Tl, Sb, Bi, Ti, Zn, Cd, Hg, and Zr); and X comprises one or more anions. In particular embodiments, C may comprise formamidinium or methylammonium. While many of the methods described below are illustrated using lead perovskite, these methods may be used to achieve other perovskites by substituting the desired metal (M) or metal halide ($MX_n$).

In some embodiments, the present disclosure provides methods of depositing perovskite based on physical vapor deposition. In further embodiments, the present disclosure provides methods of depositing perovskite based on chemical vapor deposition. Several embodiments of physical vapor and chemical vapor deposition methods are described in detail below.

In each of the embodiments described below, patterning of the resulting perovskite film may be achieved by placing a tight-fitting shadow mask directly over the substrate prior to loading the substrate into the vacuum chamber.

Physical Vapor Deposition Methods

Generally, physical vapor deposition involves vaporizing the deposition material, transporting the vapor to the target substrate, reaction between the metal atoms and a reactive gas during the transport stage, and deposition at the substrate. The present disclosure includes several embodiments of physical vapor deposition. Specifically, methods for sputtering, reactive sputtering, electron beam deposition, cathodic arc deposition, pulsed laser deposition, molecular beam epitaxy, close space sublimation, thermal evaporation and co-evaporation with annealing, vapor-assisted solution processing, ion assisted deposition, and activated reactive evaporation are described.

Sputtering

In certain embodiments, a method for solvent-free perovskite deposition comprises loading a $PbI_2$ (lead (II) iodide) target into a sputtering chamber and pumping down to high-ultra high vacuum pressure. For example, the pressure should be pumped down to less than or equal to $10^{-6}$ Torr. Preferably, systems should be under static vacuum of $10^{-8}$ torr. The method further comprises loading samples adhered to a substrate holder into a load-lock chamber. The method further comprises pumping the load-lock chamber to a high vacuum ($10^{-3}$ to $10^{-5}$ Torr) and transferring a sample holder into the sputtering chamber. In some embodiments the high vacuum may be less than $1 \times 10^{-5}$ Torr. The method further comprises applying an inert gas, such as Ar, to the $PbI_2$ target to induce a sputtering effect, backfilling the sputtering chamber with FAI (formamidinium iodide) and/or MAI (methyl ammonium iodide) vapor, and depositing a perovskite material. The chamber may be backfilled using a mass flow controller (MFC) at a rate between 2-100 sccm. In some embodiments the FM and/or MAI may be introduced at a rate between 5-30 sccm. The method contemplates the first 20 nm of perovskite should be deposited at a rate of approximately 0.5 Å/second to ensure the material is adhered to a substrate.

In other embodiments, a method for solvent-free perovskite deposition comprises loading a Pb (lead) target into a sputtering chamber and pumping down to high-ultra high vacuum pressure. For example, the pressure should be pumped down to less than or equal to $10^{-6}$ Torr. Preferably, systems should be under static vacuum of $10^{-8}$ torr. The method further comprises loading samples adhered to a substrate holder into a load-lock chamber. The method continues with pumping down the load-lock chamber to high vacuum pressure ($10^{-3}$ to $10^{-5}$ Torr) and transferring a sample holder into the load-lock chamber. The method further comprises applying an inert gas, such as Ar, to the Pb target to induce a sputtering effect, backfilling the chamber with HI (hydrogen iodide) and one or both of FAI or MAI vapor, and depositing a perovskite material. The chamber may be backfilled using an MFC at a rate between 2-100 sccm. In some embodiments the HI and one or both of MAI or FAI may be introduced at a rate between 5-30 sccm. The method contemplates the first 20 nm of perovskite should be deposited at a rate of approximately 0.5 Å/second to ensure the material is adhered to a substrate.

In yet another embodiment, a method for solvent-free perovskite material deposition comprises loading a Pb target (either Pb with HI, or $PbI_2$) into a sputtering chamber and pumping down to high-ultra high vacuum pressure. For example, the pressure should be pumped down to less than or equal to $10^{-3}$ Torr. Preferably, systems should be under static vacuum of $10^{-8}$ torr. The method further comprises loading a sample adhered to a substrate holder into a load-lock chamber and pump down the load-lock chamber to high vacuum pressure ($10^{-3}$ to $10^{-5}$ Torr) before transferring a sample holder into the chamber. The method continues with applying an inert gas, such as Ar, to the $PbI_2$ target to induce a sputtering effect, backfilling the chamber with HI, and depositing a perovskite material. Backfilling of the chamber may be accomplished using an MFC at a rate between 2-100 sccm. In some embodiments the HI may be introduced at a rate between 5-30 sccm. The method contemplates the first 20 nm of perovskite should be deposited at a rate of approximately 0.5 Å/second to ensure the material is adhered to a substrate. The method concludes with removing the $PbI_2$ film from the chamber and transferring the film to a different instrument, such as a thermal evaporator, for the deposition of FM and/or MAI.

Reactive Sputtering

In other embodiments, a method for solvent-free perovskite material deposition comprises loading a $PbI_2$ target into a sputtering chamber and pumping down to high-ultra high vacuum pressure. For example, the pressure should be pumped down to less than or equal to $10^{-6}$ Torr. Preferably, systems should be under static vacuum of $10^{-8}$ torr. The method further comprises loading samples adhered to a substrate holder into the sputtering chamber. The method further comprises pumping a load-lock chamber to high vacuum pressure ($10^{-3}$ to $10^{-5}$ Torr) and transferring a sample holder into the load-lock chamber. The method further comprises applying a reactive gas, such as oxygen or nitrogen, to the $PbI_2$ target to induce a sputtering effect, backfilling the chamber with FM and/or MM vapor, and depositing a perovskite material. The chamber may be backfilled using an MFC at a rate between 2-100 sccm. In some embodiments the FAI and/or MAI may introduced at a rate between 5-30 sccm. The method contemplates the first 20 nm of perovskite should be deposited at a rate of approximately 0.5 Å/second to ensure the material is adhered to a substrate.

In other embodiments, a method for solvent-free perovskite material deposition comprises loading a Pb (lead) target into a sputtering chamber and pumping down to high-ultra high vacuum pressure. For example, the pressure should be pumped down to less than or equal to $10^{-6}$ Torr. Preferably, systems should be under static vacuum of $10^{-8}$ torr. The method further comprises loading samples adhered to a substrate holder into a load-lock chamber. The method continues with pumping the load-lock chamber to high vacuum pressure ($10^{-3}$ to $10^{-5}$ Torr) and transferring a sample holder into the load-lock chamber. The method further comprises applying a reactive gas, such as oxygen or nitrogen, to the Pb target to induce a sputtering effect, backfilling the chamber with HI (hydrogen iodide) and one or both of FAI or MAI vapor and depositing a perovskite material. The chamber may be backfilled using an MFC at a rate between 2-100 sccm. In some embodiments the HI and one or both of MAI or FAI may be introduced at a rate between 5-30 sccm. The method contemplates the first 20 nm of perovskite should be deposited at a rate of approximately 0.5 Å/second to ensure the material is adhered to a substrate.

In yet another embodiment, a method for solvent-free perovskite material deposition comprises loading a Pb target into a sputtering chamber and pumping down to high-ultra high vacuum pressure. For example, the pressure should be pumped down to less than or equal to $10^{-6}$ Torr. Preferably, systems should be under static vacuum of $10^{-8}$ torr. The method further comprises loading a sample adhered to a substrate holder into a load-lock chamber and pumping the load-lock chamber to high vacuum pressure ($10^{-3}$ to $10^{-5}$ Torr) before transferring a sample holder into the chamber. The method continues with applying a reactive gas, such as oxygen or nitrogen, to the Pb target to induce a sputtering effect, backfilling the chamber with HI, and depositing a perovskite material. The chamber may be backfilled using an MFC at a rate between 2-100 sccm. In some embodiments the HI may be introduced at a rate between 5-30 sccm. The method contemplates the first 20 nm of perovskite should be deposited at a rate of approximately 0.5 Å/second to ensure the material is adhered to a substrate. The method concludes with removing the $PbI_2$ film from the chamber and transferring the film to a different instrument, such as a thermal evaporator, for the deposition of FAI and/or MAI.

Electron Beam Physical Vapor Depositions or Electron Beam Depositions

FIG. 1 illustrates a method 100 for solvent-free perovskite material deposition. Step 102 comprises loading a $PbI_2$ target into a deposition chamber. Step 104 comprises loading samples adhered to the substrate holder into the deposition chamber. The method 100 continues at step 106 with pumping down to a high vacuum pressure (less than or equal to $5 \times 10^{-6}$ Torr). At step 108, an electron beam is applied to the PbI$_2$ target. The method 100 then proceeds to step 110 where the deposition chamber is backfilled with FAI and/or MAI vapor. The chamber may be backfilled using an MFC at a rate between 2-100 sccm. In some embodiments the FAI and/or MAI may be introduced at a rate between 5-30 sccm. Finally, the example method concludes at step 112 by depositing a perovskite material. The method contemplates the first 20 nm of perovskite should be deposited at a rate of approximately 0.5 Å/second to ensure the material is adhered to a substrate.

In other embodiments, a method for solvent-free perovskite material deposition comprises loading a Pb target into a deposition chamber and loading samples adhered to a substrate holder into the deposition chamber. The method further comprises pumping down to a high vacuum pressure (less than or equal to $5\times10^{-6}$ Torr) and applying an electron beam to the Pb target. The method continues with backfilling the chamber with HI and formamidine and/or methylamine (MA) vapor and depositing a perovskite material. The chamber may be backfilled using an MFC at a rate between 2-100 sccm. In some embodiments the HI and FA and/or MA may be introduced at a rate between 5-30 sccm. The method contemplates the first 20 nm of perovskite should be deposited at a rate of approximately 0.5 Å/second to ensure the material is adhered to a substrate.

In yet another embodiment, a method for solvent-free perovskite material deposition comprises loading a Pb target into a deposition chamber and loading samples adhered to a substrate holder into the deposition chamber. The method further comprises pumping down to a high vacuum pressure (less than or equal to $5\times10^{-6}$ Torr) and applying an electron beam to the Pb target. The method continues with backfilling the chamber with HI vapor and depositing a perovskite material. The chamber may be backfilled using an MFC at a rate between 2-100 sccm. In some embodiments the HI may be introduced at a rate between 5-30 sccm. The method concludes with removing the PbI$_2$ film from the chamber and transferring the film to a different instrument, such as a thermal evaporator, for the deposition of FAI and/or MAI. The method contemplates the first 20 nm of perovskite should be deposited at a rate of approximately 0.5 Å/second to ensure the material is adhered to a substrate.

Cathodic Arc Physical Vapor Depositions

In certain embodiments, a method for solvent-free perovskite material deposition comprises loading a Pb target into a deposition chamber and loading samples adhered to a substrate holder into the deposition chamber. The method further comprises pumping down to ultra-high vacuum pressure ($10^{-8}$ to $10^{-12}$ Torr) and applying a cathodic arc to the Pb target. The method continues with backfilling the chamber with HI vapor and depositing a perovskite material. The chamber may be backfilled using an MFC at a rate between 2-100 sccm. In some embodiments the HI may be introduced at a rate between 5-30 sccm. The method concludes with removing the PbI$_2$ film from the chamber and transferring the film to a different instrument, such as a thermal evaporator, for the deposition of FAI and/or MAI. The method contemplates the first 20 nm of perovskite should be deposited at a rate of approximately 0.5 Å/second to ensure the material is adhered to a substrate.

Pulsed Laser Depositions

In certain embodiments, a method for solvent-free perovskite material deposition comprises loading a PbI$_2$ target into a deposition chamber and loading samples adhered to a substrate holder into the deposition chamber. The method further comprises pumping down to high vacuum pressure ($10^{-6}$ to $10^{-8}$ Torr) and applying a pulsed laser to the PbI$_2$ target. The method continues with backfilling the chamber with FM and/or MAI vapor and depositing a perovskite material. The chamber may be backfilled using an MFC at a rate between 2-100 sccm. In some embodiments the FAI and/or MAI may be introduced at a rate between 5-30 sccm. The method contemplates the first 20 nm of perovskite should be deposited at a rate of approximately 0.5 Å/second to ensure the material is adhered to a substrate.

In other embodiments, a method for solvent-free perovskite material deposition comprises loading a Pb target into a deposition chamber and loading samples adhered to a substrate holder into the deposition chamber. The method further comprises pumping down to high vacuum pressure ($10^{-3}$ to $10^{-8}$ Torr) and applying a pulsed laser to the Pb target. The method continues with backfilling the chamber with HI and one or both of MAI or FAI vapor and depositing a perovskite material. The chamber may be backfilled using an MFC at a rate between 2-100 sccm. In some embodiments the HI and one or both of MAI or FAI may be introduced at a rate between 5-30 sccm. The method contemplates the first 20 nm of perovskite should be deposited at a rate of approximately 0.5 Å/second to ensure the material is adhered to a substrate.

In yet another embodiment, a method for solvent-free perovskite material deposition comprises loading a Pb target into a deposition chamber and loading samples adhered to a substrate holder into the deposition chamber. The method further comprises pumping down to high vacuum pressure ($10^{-3}$ to $10^{-8}$ Torr) and applying a pulsed laser to the Pb target. The method continues with backfilling the chamber with HI vapor and depositing a perovskite material. The chamber may be backfilled using an MFC at a rate between 2-100 sccm. In some embodiments the HI may be introduced at a rate between 5-30 sccm. The method concludes with removing the PbI$_2$ film from the chamber and transferring the film to a different instrument, such as a thermal evaporator, for the deposition of FAI and/or MAI. The method contemplates the first 20 nm of perovskite should be deposited at a rate of approximately 0.5 Å/second to ensure the material is adhered to a substrate.

Molecular Beam Epitaxy

In certain embodiments, a method for solvent-free perovskite material deposition comprises loading a Pb target into a deposition chamber and loading samples adhered to a substrate holder into the deposition chamber. The method further comprises pumping down to ultra-high vacuum pressure ($10^{-8}$ to $10^{-12}$ Torr) and applying a molecular beam to the Pb target. The method continues with backfilling the chamber with HI vapor and depositing a perovskite material. The chamber may be backfilled using an MFC at a rate between 2-100 sccm. In some embodiments the HI may be introduced at a rate between 5-30 sccm. The method concludes with removing the PbI$_2$ film from the chamber and transferring the film to a different instrument, such as a thermal evaporator, for the deposition of FAI and/or MAI. The method contemplates the first 20 nm of perovskite should be deposited at a rate of approximately 0.5 Å/second to ensure the material is adhered to a substrate.

Close Space Sublimation

In certain embodiments, a method for solvent-free perovskite material deposition comprises loading a PbI$_2$ powder sample into a crucible and placing the substrate over the sample, face down. The method further comprises pumping down to a low vacuum pressure (~200 mTorr) and sublimating the PbI$_2$ powder sample. The method continues with backfilling a chamber with FAI and/or MAI vapor and depositing a perovskite material. The chamber may be backfilled using an MFC at a rate between 2-100 sccm. In some embodiments the FAI and/or MAI may be introduced at a rate between 5-30 sccm. The method contemplates the first 20 nm of depositions should be made at a rate of approximately 0.5 Å/second to ensure the material is adhered to a substrate.

In other embodiments, a method for solvent-free perovskite material deposition comprises loading a Pb powder sample into a crucible and covering the crucible with the Pb powder sample face down. The method further comprises pumping down to low vacuum pressure (~200 mTorr), sublimating the Pb sample, and making a first deposition. The method continues with backfilling a chamber with HI and one or both of formylimidamide (FA) or methylamine (MA) vapor and making a second deposition. The chamber may be backfilled using an MFC at a rate between 2-100 sccm. In some embodiments the HI and one or both of MA or FA may be introduced at a rate between 5-30 sccm. The method contemplates the first 20 nm of depositions should be made at a rate of approximately 0.5 Å/second to ensure the material is adhered to a substrate.

In yet another embodiment, a method for solvent-free perovskite material deposition comprise loading a $PbI_2$ powder sample into a crucible and covering the crucible with the $PbI_2$ powder sample face down. The method further comprises pumping down to low vacuum pressure (~200 mTorr), sublimating the $PbI_2$ powder sample, and making a first deposition. The method further comprises replacing the $PbI_2$ powder sample with MAI and/or FAI powder samples and placing the MAI and/or FAI powder samples face down over the crucible. The method concludes with pumping down to a pressure of 200 mTorr, sublimating the MAI and/or powder samples, and making a second deposition. The method contemplates the first 20 nm of depositions should be made at a rate of approximately 0.5 Å/second to ensure the material is adhered to a substrate.

In a further embodiment, a method for solvent-free perovskite deposition comprises growing a single crystal perovskite with the structure $ABX_3$ by any method known to those skilled in the art. The method further comprises loading a single crystal into a crucible and loading the substrate face down into the substrate holder. Depending on the size of the crystals, it may be necessary to crush the crystal perovskite into more uniform pieces with a mortar and pestle. The method further comprises pumping down to low vacuum pressure (~200 mTorr), sublimating the crystal, and making a first deposition.

Thermal Evaporating and Co-Evaporation with Annealing

In certain embodiments, a method for solvent-free perovskite material deposition comprises loading a $PbI_2$ powder sample into a crucible and loading substrates on a sample holder. The method further comprises pumping down to high vacuum pressure (less than or equal to $5\times10^{-3}$ Torr) and evaporating the $PbI_2$ powder sample by applying a voltage between two metal posts. The method continues with backfilling a chamber with FAI and/or MAI vapor and making depositions. The chamber may be backfilled using an MFC at a rate between 2-100 sccm. In some embodiments the FAI and/or MAI may be introduced at a rate between 5-30 sccm. The method contemplates the first 20 nm of depositions should be made at a rate of approximately 0.5 Å/second to ensure the material is adhered to a substrate.

In other embodiments, a method for solvent-free perovskite material deposition comprises loading a $PbI_2$ powder sample into a first crucible and loading MAI and/or FAI samples into a second crucible. The method further comprises loading substrates on a sample holder and pumping down to a high vacuum pressure (less than or equal to $5\times10^{-6}$ Torr). The method continues with evaporating the $PbI_2$ and the MAI and/or FAI samples by applying a voltage between two metal posts, and depositing $PbI_2$ and MAI and/or FAI at the same time. The method contemplates the first 20 nm of depositions should be made at a rate of approximately 0.5 Å/second to ensure the material is adhered to a substrate.

In yet another embodiment, a method for solvent-free perovskite material deposition comprises loading a Pb sample into a crucible, loading substrates on a sample holder, and pumping down to high vacuum pressure (less than or equal to $5\times10^{-6}$ Torr). The method further comprises evaporating the Pb sample by applying a voltage between two metal posts. The method continues with backfilling the chamber with HI and one or both of FAI or MAI vapor and making depositions. The chamber may be backfilled using an MFC at a rate between 2-100 sccm. In some embodiments the HI and one or both of MAI or FM may be introduced at a rate between 5-30 sccm. The method contemplates the first 20 nm of depositions should be made at a rate of approximately 0.5 Å/second to ensure the material is adhered to a substrate.

In further embodiments, a method for solvent-free perovskite material deposition comprises loading a $PbI_2$ powder sample into a crucible, loading substrates on a sample holder, and pumping down to high vacuum pressure (less than or equal to $5\times10^{-6}$ Torr). The method further comprises evaporating the $PbI_2$ powder sample by applying a voltage between two metal posts and making a first deposition. The method continues with replacing the $PbI_2$ powder sample with a MAI and/or FAI powder sample and pumping down to high vacuum pressure (less than or equal to $5\times10^{-6}$ Torr). The method concludes by evaporating the MAI and/or FAI powder sample by applying a voltage between two metal posts and making a second deposition. The method contemplates the first 20 nm of depositions should be made at a rate of approximately 0.5 Å/second to ensure the material is adhered to a substrate.

In yet other embodiments, a method for solvent-free perovskite material deposition comprises growing a single crystal perovskite with the structure $ABX_3$ by any method. The method further comprises loading the single crystal(s) into a crucible. In some instances, it may be necessary to crush the crystal(s) in a mortar and pestle to achieve more uniform, smaller pieces. The method further comprises loading samples into a substrate holder. The method further comprises pumping down the deposition chamber to high vacuum pressure (less than or equal to $5\times10^{-6}$ Torr). The method concludes by applying a voltage to two metal posts connected to the precursor crucible to evaporate the crystal(s), and making a deposition on the sample.

Vapor-Assisted Solution Processing or Hybrid Physical Chemical Deposition

In certain embodiments, a method for solvent-free perovskite material deposition comprises depositing a layer of $PbI_2$ onto a film by any of the above disclosed methods. The $PbI_2$ film may be patterned with the use of a tight-fitting shadow mask. The method further comprises placing the film with the $PbI_2$ layer face up in a reduced pressure chamber (between 200 mTorr and $10^{-6}$ Torr) and introducing hydrogen iodide (HI) vapor. The method concludes with flowing methylamine (MA) and/or formylimidamide (FA) vapor, which may exist as its tautomer formamidine in the gas phase, into the reduced pressure chamber. The MA and/or FA vapor may be introduced using an MFC at a rate between 2-100 sccm. In some embodiments it may be introduced at a rate between 5-30 sccm.

In certain embodiments, a method for solvent-free perovskite material deposition comprises depositing a layer of $HPbI_3$ onto a film by any of the above disclosed methods. The method further comprises placing the film with the $HPbI_3$ layer face up in a reduced pressure chamber. The method concludes with flowing methylamine ($CH_3NH_2$) and/or formylimidamide ($NH_2CHNH$) vapor into the reduced pressure chamber. Alternatively, methylamine ($CH_3NH_2$) and/or formylimidamide ($NH_2CHNH$) vapor is added to $PbI_2$ first, and then followed by HI.

Thermal Spraying (Spray Coating)

In certain embodiments, a method for solvent-free perovskite material deposition comprises spraying a $PbI_2$ sample, heated to 20-80° C., onto a film at atmospheric pressure and placing the film with the $PbI_2$ layer face up in a reduced pressure chamber (between 200 mTorr and $10^{-6}$ Torr). The method concludes with flowing MA and/or FA vapor into the reduced pressure chamber. The MA and/or FA vapor may be introduced using an MFC at a rate between 2-100 sccm. In some embodiments it may be introduced at a rate between 5-30 sccm.

Ion Plating or Ion Assisted Deposition

In certain embodiment, a method for solvent-free perovskite material deposition comprises loading a Pb target into a deposition chamber, loading samples adhered to a substrate holder into the deposition chamber, and pumping down the chamber to less than or equal to $10^{-5}$ Torr. In some embodiments, the chamber is pumped down to $10^{-8}$ Torr. The method further comprises evaporating the Pb target by striking the source material with a bombardment of particles. Vaporization by particle bombardment may be accomplished using evaporation, sputtering, arc vaporization, or chemical means. This form of vaporization requires the addition of inert (e.g., Ar) or reactive (e.g., $O_2$ or $N_2$) gas. The method further comprises backfilling the chamber with HI vapor and making depositions. The chamber may be backfilled using an MFC at a rate between 2-100 sccm. In some embodiments the HI may be introduced at a rate between 5-30 sccm. The method concludes with removing the $PbI_2$ film from the chamber and transferring the film to a different instrument, such as a thermal evaporator, for the deposition of FAI and/or MAI. The method contemplates the first 20 nm of depositions should be made at a rate of approximately 0.5 Å/second to ensure the material is adhered to a substrate.

Activated Reactive Evaporation

In certain embodiments, a method for solvent-free perovskite material deposition comprises loading a $PbI_2$ target into a deposition chamber, loading samples adhered to a substrate holder into the deposition chamber, and pumping down to a high vacuum pressure (less than or equal to $5 \times 10^{-6}$ Torr). The method further comprises evaporating the $PbI_2$ target in the presence of a reactive gas and a plasma. The method continues with backfilling the chamber with FAI and/or MAI vapor and making depositions. The chamber may be backfilled using an MFC at a rate between 2-100 sccm. In some embodiments the FAI and/or MAI may be introduced at a rate between 5-30 sccm. The method contemplates the first 20 nm of depositions should be made at a rate of approximately 0.5 Å/second to ensure the material is adhered to a substrate.

In other embodiments, a method for solvent-free perovskite material deposition comprises loading a Pb target into a deposition chamber, loading samples adhered to a substrate holder into the deposition chamber, and pumping down to a high vacuum pressure (less than or equal to $5 \times 10^{-6}$ Torr). The method further comprises evaporating the Pb target in the presence of a reactive gas and a plasma. The method continues with backfilling the chamber with HI and one or both of MAI or FAI vapor and making depositions. The chamber may be backfilled using an MFC at a rate between 2-100 sccm. In some embodiments the HI and one or both of MAI or FAI may be introduced at a rate between 5-30 sccm. The method contemplates the first 20 nm of depositions should be made at a rate of approximately 0.5 Å/second to ensure the material is adhered to a substrate.

In yet another embodiment, a method for solvent-free perovskite material deposition comprises loading a Pb target into a deposition chamber, loading samples adhered to a substrate holder into the deposition chamber, and pumping down to a high vacuum pressure (less than or equal to $5 \times 10^{-6}$ Torr). The method further comprises evaporating the Pb target in the presence of a reactive gas and a plasma. The method continues with backfilling the chamber with HI vapor and making depositions. The chamber may be backfilled using an MFC at a rate between 2-100 sccm. In some embodiments the HI may be introduced at a rate between 5-30 sccm. The method concludes with removing the $PbI_2$ film from the deposition chamber and transferring the film to a different instrument, such as a thermal evaporator, for the deposition of FM and/or MAI. The method contemplates the first 20 nm of depositions should be made at a rate of approximately 0.5 Å/second to ensure the material is adhered to a substrate.

Chemical Vapor Deposition

Generally, chemical vapor deposition involves vaporizing a precursor, transporting the vapor to the target substrate, chemical reaction between the precursor vapors and the surface to be coated, and deposition at the substrate. Various precursors may be used with each of the chemical vapor deposition methods described below. Possible lead precursors generally include lead alkoxides, lead alkylamides, lead alkylsulfides, lead alkylselenides, plumbanes, and plumbylenes. In some embodiments the lead precursor may be bis(1-dimethylaminio-2-methyl-2-propanolate)lead (II) (Pb$(DMAMP)_2$); bis(2,2,6,6-tetramethyl-3,5,heptanedionato)lead(II) (Pb$(THD)_2$); lead(II) hexafluoroacetylacetonate; plumbocene (PbCp$_2$); tetraethyllead(IV); bis[bis(trimethylsilyl)amido] lead(II); or rac-$N^2,N^3$-di-tert-butane-2,3-diamido lead (II). Possible iodine precursors generally include metal iodides and alkylammonium iodide salts. In some embodiments the iodine precursor may be trimethylsilyl iodide (TMSI); iodine ($I_2$); hydrogen iodide (HI); hydroiodic acid; tin (IV) iodide; or methylammonium iodide. Possible formamidinium iodide precursors generally include formamidinium salts, formamidinium precursor reagents (formates, imidic esters, triazines), ammonium salts, and cyanide salts. In some embodiments the formamidinium precursor may be formamidinium iodide (FAI); formamidinium acetate; triethoxyl orthoformate; ethyl methanimidinium iodide; 1,3,5-Triazine; ammonia ($NH_3$); ammonium iodide ($NH_4I$); ammonium hydroxide ($NH_4OH$); or hydrogen cyanide (HCN).

The present disclosure includes several embodiments of physical vapor deposition. Specifically, methods for atomic layer deposition, plasma enhanced chemical vapor deposition, metal-organic vapor phase epitaxy, hydride vapor phase epitaxy, thin-film vapor liquid-solid conversion, and liquid phase epitaxy are described.

Atomic Layer Deposition

In certain embodiments, a method for solvent-free perovskite material deposition comprises loading a $PbI_2$ precursor into a deposition chamber and loading a FAI sample into the deposition chamber. The method further comprises pumping down to low vacuum pressure (100-500 mTorr), pulsing a first $PbI_2$ precursor for at least 0.015 seconds, waiting 10-30 seconds to allow time for a reaction to occur at the substrate, pulsing a second $PbI_2$ for at least 0.015 seconds, waiting 10-30 seconds to allow time for a reaction to occur at the substrate, and then repeating the cycle until the desired material thickness is achieved. Depositions are made under carrier gas, typically $N_2$. In certain embodiments, the method requires depositing PbS into a deposition chamber and producing $PbI_2$ before loading the $PbI_2$ precursor into the deposition chamber.

For example, after loading a FAI sample into the deposition chamber and pumping down the vacuum to low vacuum pressure, lead (II) acetate is introduced to the chamber, making a first deposition. After waiting 30 seconds, trimethylsilyl iodide is introduced to the chamber, making a second deposition. The second deposition reacts with the first deposition to form a layer of $PbI_2$. The example method further comprises waiting another 30 seconds before restarting the cycle by introducing lead (II) acetate to the chamber. Lead (II) acetate and trimethylsilyl iodide may be introduced using an MFC at a rate between 2-100 sccm. In some embodiments they may be introduced at a rate between 5-30 sccm.

As another example, after loading the FAI sample into the deposition chamber and pumping down the vacuum to low vacuum pressure, PbS is introduced to the chamber, making a first deposition. After waiting 30 seconds, TMSI is introduced to the chamber, making a second deposition. The second deposition reacts with the first deposition to form a layer of $PbI_2$. The example method further comprises waiting another 30 seconds before restarting the cycle by introducing PbS. PbS and TMSI may be introduced using an MFC at a rate between 2-100 sccm. In some embodiments they may be introduced at a rate between 5-30 sccm.

In other embodiments, a method for solvent-free perovskite material deposition comprises loading a $PbI_2$ precursor into a deposition chamber, loading a FM sample into the deposition chamber, and pumping down to low vacuum pressure (100-500 mTorr). In certain embodiments, the method requires depositing PbS into a deposition chamber and producing $PbI_2$ before loading the $PbI_2$ precursor into the deposition chamber. The method further comprises alternating between making $PbI_2$ precursor depositions and making FAI depositions onto a film. The method concludes with placing the $PbI_2$ precursor face up in a reduced pressure chamber and flowing MAI and/or FAI vapor into the reduced pressure (between 200 mTorr and $10^{-6}$ Torr) chamber. The MM and/or FAI vapor may be introduced using an MFC at a rate between 2-100 sccm. In some embodiments it may be introduced at a rate between 5-30 sccm.

For each of the atomic layer deposition methods described above, the substrate may be selectively patterned prior to being placed in the deposition chamber. For example, patterning may be applied using $O_2$ plasma, ozone cleaning, or other surface modification techniques known to those skilled in the art. Patterning provides selective areas to which nucleation of precursors may adhere.

Plasma Enhanced Chemical Vapor Deposition

In certain embodiments, a method for solvent-free perovskite material deposition comprises loading a Pb precursor into a crucible, loading substrates on a sample holder, and pumping down to high vacuum pressure (at least $10^{-3}$ Torr). The method further comprises introducing a reactive gas into the deposition chamber and applying a current to ionize the reactive gas and the Pb precursor. The method concludes with backfilling a chamber with FAI and/or MAI vapor and making depositions. In some embodiments, backfilling also includes introducing reactive gases. Suitable reactive gases, in addition to those already mentioned in this disclosure, include water, oxygen, nitrous oxide, ammonia, and nitrogen. The chamber may be backfilled using an MFC at a rate between 2-100 sccm. In some embodiments the FAI and/or MAI (and reactive gas where appropriate) may be introduced at a rate between 5-30 sccm. The method contemplates the first 20 nm of depositions should be made at a rate of approximately 0.5 Å/second to ensure the material is adhered to a substrate.

In other embodiments, a method for solvent-free perovskite material deposition comprises loading a Pb precursor into a crucible, loading substrates on a sample holder, and pumping down to high vacuum pressure (at least $10^{-3}$ Torr). The method further comprises applying a current to ionize the Pb precursor. The method continues with backfilling the chamber with HI and one or both of MAI or FAI and making depositions. The chamber may be backfilled using an MFC at a rate between 2-100 sccm. In some embodiments the HI and one or both of MAI or FAI may be introduced at a rate between 5-30 sccm. The method contemplates the first 20 nm of depositions should be made at a rate of approximately 0.5 Å/second to ensure the material is adhered to a substrate.

In yet another embodiment, a method for solvent-free perovskite material deposition comprises loading a $PbI_2$ precursor into a crucible, loading substrates on the sample holder, and pumping down to a high vacuum pressure (at least $10^{-3}$ Torr). The method further comprises applying a current to ionize the $PbI_2$ precursor and making depositions. In some embodiments, reactive gases may be introduced before ionizing the precursor. Any of the previously mentioned reactive gases are suitable. The method continues with transferring the film to an instrument, such as a thermal evaporator, and flowing MA and/or FA vapor into the reduced pressure chamber (between 200 mTorr and $10^{-6}$ Torr). The MA and/or FA vapor may be introduced using an MFC at a rate between 2-100 sccm. In some embodiments it may be introduced at a rate between 5-30 sccm. The method concludes with making MAI and/or FAI depositions.

Metalorganic Vapor Phase Epitaxy (Metalorganic Chemical Vapor Deposition)

In certain embodiments, a method for solvent-free perovskite material deposition comprises loading a Pb precursor into a crucible, loading substrates on a sample holder, pumping down the chamber to moderate pressure (between 5 Torr and 760 torr), and applying one of heat or a flow of electrons to the Pb precursor create Pb vapor. The method further comprises applying a metalorganic vapor phase epitaxy process to the Pb vapor. The method continues with backfilling a chamber with FM and/or MAI vapor, and making depositions under an inert carrier gas such as Ar. The chamber may be backfilled using an MFC at a rate between 2-100 sccm. In some embodiments the FAI and/or MAI vapor may be introduced at a rate between 5-30 sccm. The method contemplates the first 20 nm of depositions should be made at a rate of approximately 0.5 Å/second to ensure the material is adhered to a substrate.

In other embodiments, a method for solvent-free perovskite material deposition comprises loading a Pb precursor into a crucible, loading substrates on a sample holder, pumping down the chamber to moderate pressure (between 5 Torr and 760 torr), and applying one of heat or a flow of electrons to the Pb precursor create Pb vapor. The method further comprises applying a metalorganic vapor phase epitaxy process to the Pb vapor. The method continues with backfilling a chamber with HI and one or both of MAI or FAI, and making depositions under an inert carrier gas such as Ar. The chamber may be backfilled using an MFC at a rate between 2-100 sccm. In some embodiments the HI and one or both of MAI or FAI vapor may be introduced at a rate between 5-30 sccm. The method contemplates the first 20 nm of depositions should be made at a rate of approximately 0.5 Å/second to ensure the material is adhered to a substrate.

In yet another embodiment, a method for solvent-free perovskite material deposition comprises loading a Pb precursor into a crucible, loading substrates on a sample holder, and pumping down the chamber to moderate pressure (between 5 Torr and 760 torr). The method further comprises applying one of heat or a flow of electrons to the Pb precursor create Pb vapor. The method further comprises applying a metalorganic vapor phase epitaxy process to the Pb vapor under an inert carrier gas such as Ar. The method continues with transferring the film to an instrument, such as a thermal evaporator, and depositing FAI and/or MAI. The method contemplates the first 20 nm of depositions should be made at a rate of approximately 0.5 Å/second to ensure the material is adhered to a substrate.

In each of the embodiments described above for metalorganic vapor phase epitaxy, the Pb precursor may plumbocene or a plumbylene. Any of the other Pb precursors detailed in this disclosure are also suitable.

Hydride Vapor Phase Epitaxy

In certain embodiments, a method for solvent-free perovskite material deposition comprises loading a Pb precursor into a crucible, loading substrates on a sample holder, pumping down the chamber to moderate pressure (between 5 Torr and 760 torr), and applying one of heat or a flow of electrons to the Pb precursor create Pb vapor. The method further comprises applying HCl (hydrochloric acid). The method continues with backfilling a chamber with HI and one or both of MAI or FAI vapor and making depositions. The chamber may be backfilled using an MFC at a rate between 2-100 sccm. In some embodiments the HI and one or both of MAI or FAI vapor may be introduced at a rate between 5-30 sccm. Carrier gases are used in some embodiments to facilitate deposition. Suitable carrier gases include $NH_3$, $H_2$, and chlorides. The method contemplates the first 20 nm of depositions should be made at a rate of approximately 0.5 Å/second to ensure the material is adhered to a substrate.

In other embodiments, a method for solvent-free perovskite material deposition comprises loading a Pb precursor into a crucible, loading substrates on a sample holder, pumping down the chamber to moderate pressure (between 5 Torr and 760 torr), and applying one of heat or a flow of electrons to the Pb precursor create Pb vapor. The method further comprises applying HCl. The method continues with backfilling a chamber with HI vapor and making depositions to a film. The chamber may be backfilled using an MFC at a rate between 2-100 sccm. In some embodiments the HI may be introduced at a rate between 5-30 sccm. Carrier gases are used in some embodiments to facilitate deposition. Suitable carrier gases include $NH_3$, $H_2$, and chlorides. The method concludes with transferring the film to an instrument, such as a thermal evaporator, and depositing FAI and/or MAI.

Thin-Film Vapor-Liquid-Solid Conversion

In certain embodiments, a method for solvent-free perovskite deposition comprises applying at least one of heat or a flow of electrons to a metal, C (where C is e.g. group I or II cations as listed in the preferred embodiments), M (e.g. Pb, Sn, etc. as described in Preferred Embodiments), or a blend of metals C and M to evaporate the metals onto a substrate. The method further comprises the direct application of the liquid metal C or M, or alloys or compounds thereof (e.g. lead(II) acetate trihydrate). The method continues with heating the substrate and stabilizing the temperature above the melting point of the metal or metal blend. The method further comprises the use of substrate surface treatments and inert porous capping layers to prevent de-wetting of the liquid metal or metals from the substrate. The method continues with application of HX, $X_2$, and/or CX vapor to the chamber to produce a thin film of the compound $CMX_3$. In particular embodiments HI, $I_2$ and/or CsI vapor are applied to the chamber containing a liquid metal film of Pb, Cs, or Cs and Pb to form a thin film of $CsPbI_3$. In certain embodiments the method further comprises the use of other compounds to stabilize the CX vapor at high temperatures including C decay products in the case that C is an organic cation that may otherwise be unstable at the temperature required to melt the metals C, M or CM alloy. Alternate precursor compounds, for example lead (II) acetate trihydrate, may be used.

Liquid Phase Epitaxy

Any of the embodiments of thin-film vapor-liquid-solid conversion described above may be executed on a crystalline substrate with the goal of epitaxial growth. In some embodiments, the substrate may be single crystalline perovskite substrates or other lattice matched compounds.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A method for solvent-free perovskite deposition comprising:
   loading a lead target and a substrate into a deposition chamber;
   reducing the pressure in the deposition chamber to less than or equal to $5 \times 10^{-6}$ Torr;
   vaporizing the lead target;

backfilling, using a mass flow controller (MFC), the deposition chamber with the vapors of a salt precursor to form a thin film on the substrate, wherein the salt precursor comprises hydrogen iodide and wherein the backfilling occurs at a rate in a range of 2-100 sccm, and wherein the thin film comprises lead iodide;

transferring the thin film to a thermal evaporator; and depositing a second salt precursor on the thin film to form a perovskite material on the substrate, wherein the second salt precursor selected from the group consisting of formamidinium iodide, methyl ammonium iodide, and combinations thereof.

2. The method of claim 1, wherein the first 20 nm of depositions are made at a rate of 0.5 Å/second.

3. The method of claim 1, wherein:
vaporizing occurs by applying an electron beam to the lead target.

4. The method of claim 1, wherein:
vaporizing occurs by applying a cathodic arc to the lead target; and
the pressure in the chamber is reduced to the range of $10^{-8}$ to $10^{-12}$ Torr.

5. The method of claim 1, wherein:
vaporizing occurs by applying a pulsed laser to the lead target; and
the pressure in the chamber is reduced to the range of $10^{-8}$ to $10^{-12}$ Torr.

6. The method of claim 1, wherein the lead target consisting of lead (Pb).

* * * * *